(12) United States Patent
Johnson

(10) Patent No.: US 7,596,016 B2
(45) Date of Patent: Sep. 29, 2009

(54) OPTICALLY ACCESSIBLE PHASE CHANGE MEMORY

(75) Inventor: Brian G. Johnson, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 1357 days.

(21) Appl. No.: 10/634,146

(22) Filed: Aug. 4, 2003

(65) Prior Publication Data

US 2005/0030784 A1 Feb. 10, 2005

(51) Int. Cl.
*G11C 11/00* (2006.01)
(52) U.S. Cl. .................. 365/163; 365/148; 365/215; 365/113
(58) Field of Classification Search ................ 365/163, 365/215, 113, 34, 234, 148; 438/95; 257/52, 257/53, 16, 60
See application file for complete search history.

(56) References Cited

U.S. PATENT DOCUMENTS

| | | | | |
|---|---|---|---|---|
| 3,778,785 A * | 12/1973 | von Gutfeld | ................ | 365/113 |
| 4,795,657 A * | 1/1989 | Formigoni et al. | ............ | 438/73 |
| 5,206,829 A * | 4/1993 | Thakoor et al. | ............. | 365/117 |
| 5,335,219 A * | 8/1994 | Ovshinsky et al. | .......... | 369/288 |
| 6,005,791 A * | 12/1999 | Gudesen et al. | ............. | 365/114 |
| 6,850,432 B2 * | 2/2005 | Lu et al. | ...................... | 365/163 |
| 6,864,503 B2 * | 3/2005 | Lung | ........................... | 257/30 |
| 6,867,425 B2 * | 3/2005 | Wicker | ........................ | 257/3 |
| 6,914,255 B2 * | 7/2005 | Lowrey | ...................... | 257/5 |
| 6,969,867 B2 * | 11/2005 | Ovshinsky | .................... | 257/4 |
| 7,106,622 B2 * | 9/2006 | Nangle | ........................ | 365/163 |
| 7,161,167 B2 * | 1/2007 | Johnson | ........................ | 257/5 |
| 2003/0128646 A1 * | 7/2003 | Nangle | ........................ | 369/100 |
| 2005/0029503 A1 * | 2/2005 | Johnson | ........................ | 257/4 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 20-26, 2003.

(Continued)

*Primary Examiner*—Huan Hoang
(74) *Attorney, Agent, or Firm*—Trop, Pruner & Hu, P.C.

(57) ABSTRACT

A phase change memory may be configured to enable both optical and electrical accessing of the memory. In one embodiment, each cell may be electrically accessed by a laser beam, and at the same time each cell may be electrically accessed by electrical addressing signals.

10 Claims, 2 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

OPTICALLY ACCESSIBLE PHASE CHANGE MEMORY

BACKGROUND

This invention relates generally phase change memories.

Phase change memories use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the material (e.g., crystalline or amorphous).

Thus, there is a need for better ways to use phase change memories.

BRIEF SUMMARY OF THE INVENTION

A phase change memory may be both optically and electrically programmed. Thus, the memory may include the capability to be both optically programmed, in some cases, and electrically programmed in other cases.

DETAILED DESCRIPTION

Figure 1:
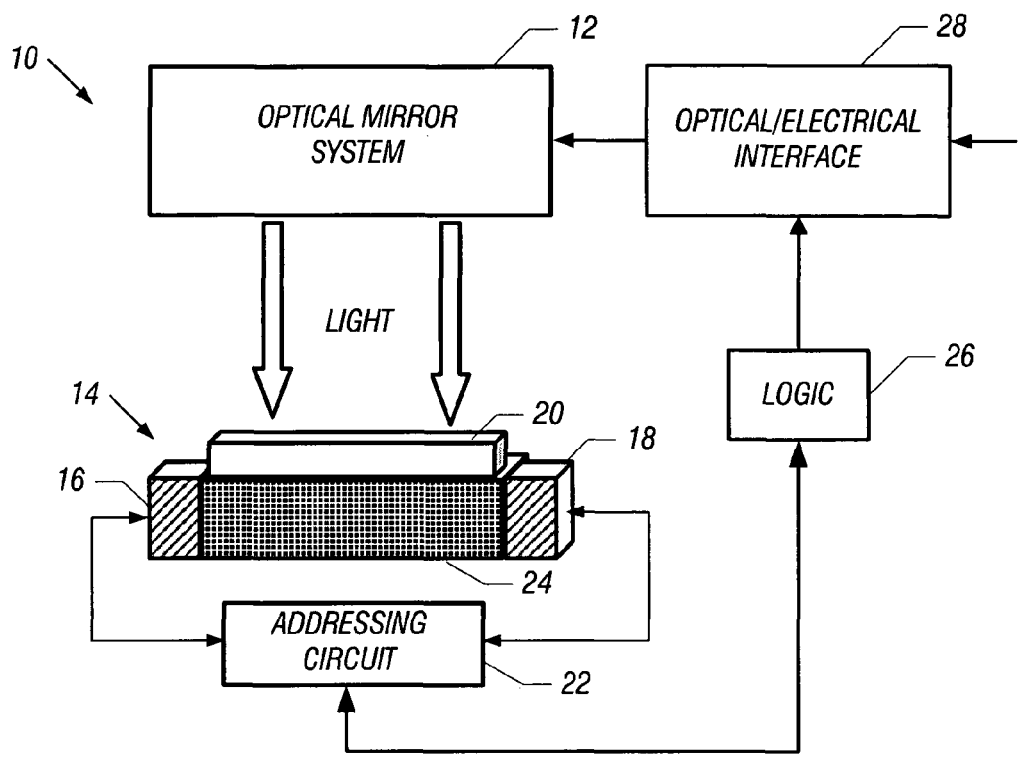
FIG. 1 is a schematic depiction of one embodiment of the present invention.

Referring to FIG. 1, a phase change memory 10 may be both electrically and optically accessed. By the term "accessed" it is intended to refer to one or more of erasing, reading, and programming.

A phase change memory cell 14 may be coupled to an addressing circuit 22. The circuit 22, in one embodiment, may generate row and column signals that may cause potentials or currents to be applied to the electrodes 16 and 18. In one embodiment, the phase change material 24 may function as a variable resistor whose resistance may be optically and electrically altered. In addition, once its resistance has been altered, by passing a current through the variable resistance, the memory cell 14 may be read.

The circuit 22 may be coupled to logic 26, in turn coupled to an optical/electrical interface 28. The interface 28 may receive addressing commands from a suitable electronic device. These commands may be converted into an appropriate form by the logic 26 to change the information stored in the memory cell 14, to either high or low resistance states. These states can then be read out through the circuitry 22.

The interface 28 may also develop optical signals that may be used to alter the state of the memory cell 14. For example, in one embodiment, an optical mirror system 12 may control the application of laser light to specific cells within the memory cell 14. In one embodiment, the system 12 may be a micro-mirror system, so that laser light may be deflected to expose one of a large array of memory cells each having phase change material 24.

The memory cell 14 may be covered and protected by an overlying layer 20. In one embodiment, the layer 20 may be a transparent layer to permit the passage of light. The layer 20 may also thermally insulate the phase change material 24.

The array of cells may be arranged in rows and columns, although the terms rows and columns are to some degree arbitrary. Those rows and columns of memory cells may then be electrically accessed, as well as being optically accessed.

In one embodiment, if the memory material 24 is a non-volatile, phase change material, the memory material 24 may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material 24 may be adapted to be altered to one of at least two resistance values within a range of resistance values to provide single bit or multi-bit storage of information.

Programming of the memory material 24 to alter the state or phase of the material may be accomplished by applying voltage potentials to the electrodes 16 and 18, thereby generating a voltage potential across the memory material 24. An electrical current may flow through a portion of the memory material 24 in response to the applied voltage potentials, and may result in heating of the memory material 24.

This heating and subsequent cooling may alter the memory state or phase of the memory material 24. Altering the phase or state of the memory material 24 may alter an electrical characteristic of the memory material 24. For example, resistance of the material 24 may be altered by altering the phase of the memory material 24. The memory material 24 may also be referred to as a programmable resistive material or simply a programmable material.

In one embodiment, a voltage potential difference of about 3 volts may be applied across a portion of the memory material 24 by applying about 3 volts to one electrode 16 or 18 and about zero volts to the other electrode 16 or 18. A current flowing through the memory material 24 in response to the applied voltage potentials may result in heating of the memory material. This heating and subsequent cooling may alter the memory state or phase of the material.

In a "reset" state, the memory material 24 may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphisize memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material 24 may be read by measuring the resistance of the memory material. As an example, a read current may be provided to the memory material using opposed electrodes 16, 18 and a resulting read voltage across the memory material may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Figure 2:
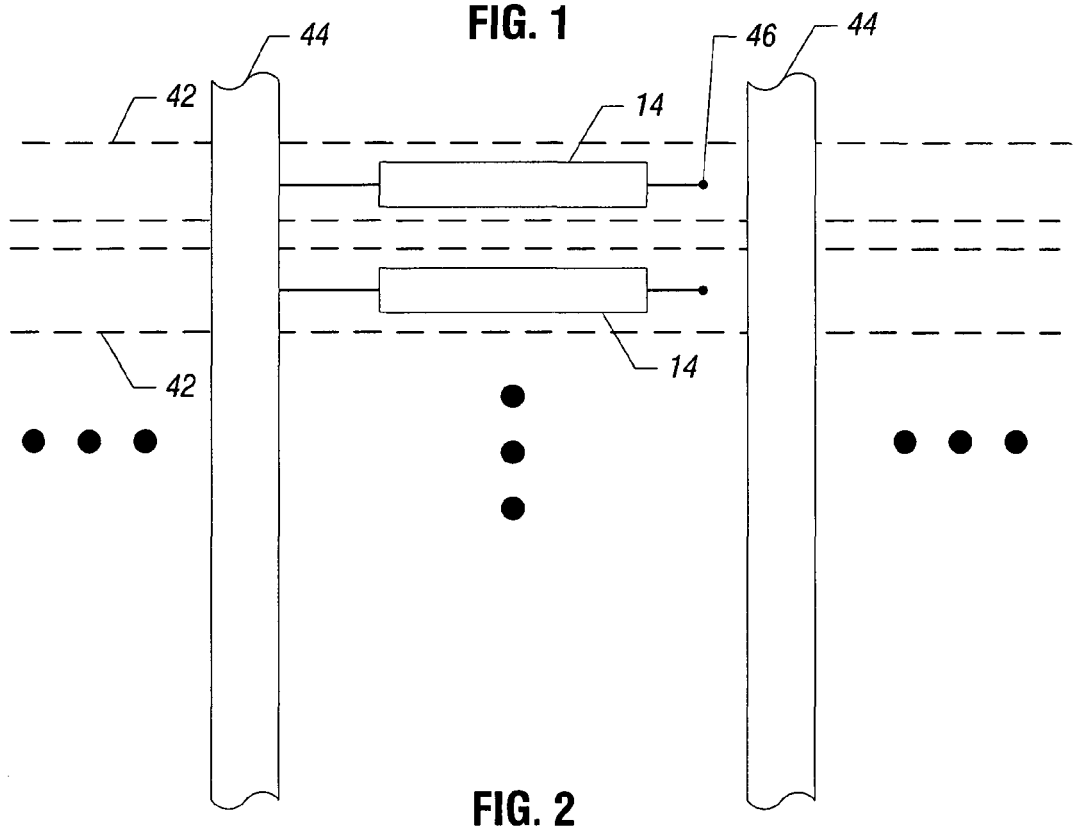
FIG. 2 is a top plan view of an array in accordance with one embodiment of the present invention.

Referring to FIG. 2, in one embodiment, cells 14 may be coupled to column lines 44 and, through vias 46, to generally transversely arranged row lines 42. In one embodiment, the row lines 42 may be formed below the material 34, for example, in a semiconductor substrate. In one embodiment, the column lines 44 may be formed above the material 24. Thus, the row lines 42 may extend parallel to one another and may have vias 46 that extend upwardly to contact one of the electrodes 16 or 18 of a cell 14. The other electrode 16 or 18 may be coupled to a column line 42. Thus, each memory cell 24 may be arranged in an addressable location, accessible through rows 42 and columns 44. While an illustrative arrangement is illustrated in FIG. 2, many other arrangements are also possible.

When laser light is deflected through the mirror system 12 to expose a selected cell 14, localized heating of the phase change material 24 may occur. This heating alters the resistivity of the phase change material 24 as discussed above in connection with electrical heating of the material 24.

In one embodiment of the present invention, each cell 14 may act as an optical to electrical transducer. For example, information in an optical form may be optically programmed into an array of cells 14. Then that information may be electrically read out so that optical information has now been converted into electrical information.

Generally, with phase change memories, the memory cells 14 are read before they are programmed to determine their present state. The cells 14 may be in either a set or reset state depending on their previous programming. Thus, the optical and electrical systems read the cell 14 to be programmed to know what state it is in at any time. In order to program the cell 14, the present state of the cell is determined and then the cell is converted into the desired state. Thus, there need be no problem with two independent systems independently accessing and programming the same memory cell 14.

Optically writing of information in the crystalline state optically may be slower than electrical alteration of the phase change memory into the crystalline state. However, transforming from the amorphous to the crystalline state may advantageously use the electrical programming in some embodiments. Light programming may be used when going from the crystalline to the amorphous state in one embodiment of the present invention.

In one embodiment of the present invention, the programming may be done optically or electrically. In such an embodiment, reading may be done by sensing current by applying a low bias to detect the memory state. In the dual mode, combinations of optical and electrical programming may be combined with feedback sensing.

Figure 3:
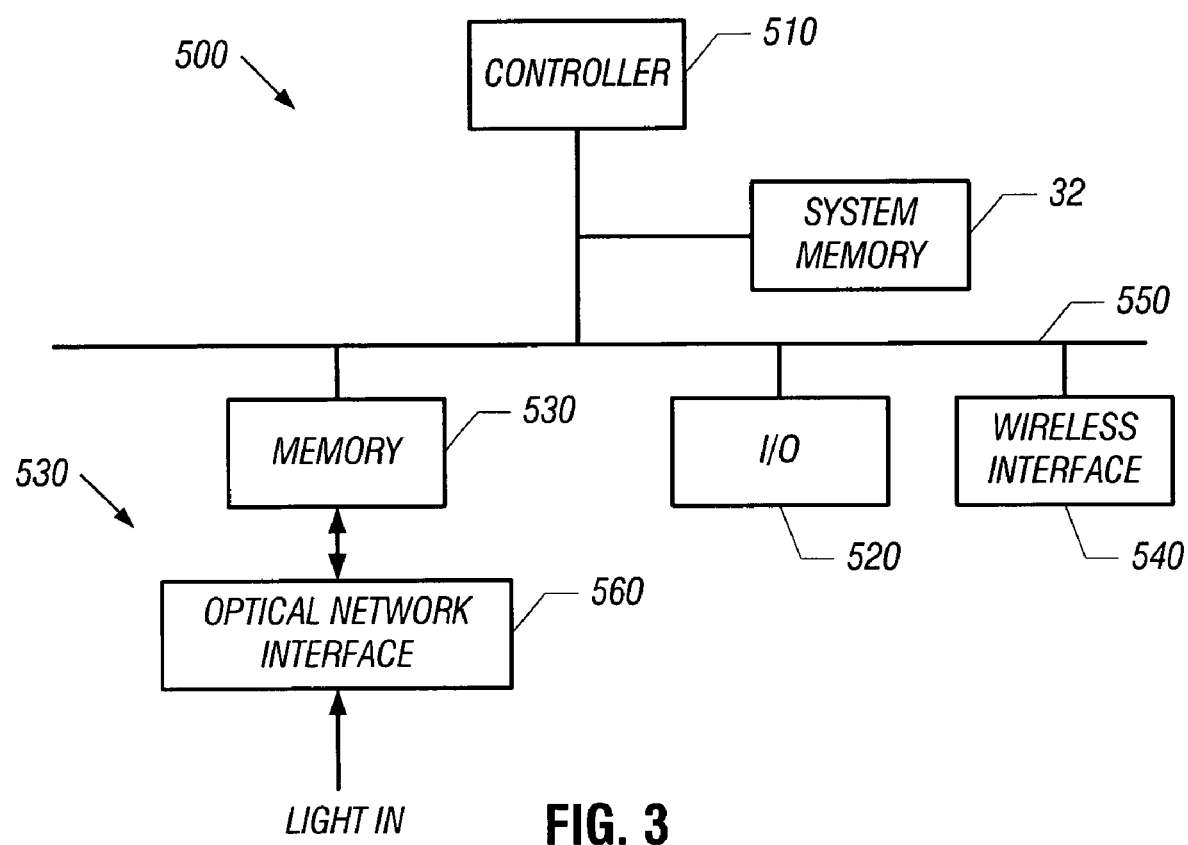
FIG. 3 is a schematic depiction of a system in accordance with one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data.

Memory 530 may be provided by one or more different types of memory. For example, memory 530 may comprise a volatile memory (any type of random access memory), a non-volatile memory such as a flash memory, and/or phase change memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect.

An optical network interface 560 may include one or more of the components 12, 28, and 26, shown in FIG. 1. The optical network interface receives a light signal and provides it in an appropriate format to the memory 530, in one embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   optically programming a phase change memory after electrically programming said memory.

2. The method of claim 1 including forming a phase change memory with a pair of parallel spaced electrodes and a phase change material between said electrodes.

3. The method of claim 2 including arranging said phase change material and said electrodes laterally.

4. The method of claim 3 including enabling light exposure of said phase change material.

5. The method of claim 4 including enabling light exposure through a thermally insulating material.

6. The method of claim 3 including enabling said phase change material to be electrically accessed through rows and columns.

7. The method of claim 6 including locating said rows and columns to enable light access to said cells.

8. The method of claim 7 including positioning one of said rows and columns below said phase change material.

9. The method of claim 8 including providing a via coupling one of said electrodes to said underlying row or column.

10. The method of claim 1 including using the phase change memory to convert an optical signal to an electrical signal.

* * * * *

UNITED STATES PATENT AND TRADEMARK OFFICE
CERTIFICATE OF CORRECTION

PATENT NO. : 7,596,016 B2
APPLICATION NO. : 10/634146
DATED : September 29, 2009
INVENTOR(S) : Brian G. Johnson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1452 days.

Signed and Sealed this

Twenty-eighth Day of September, 2010

David J. Kappos
*Director of the United States Patent and Trademark Office*